(12) United States Patent
Oza et al.

(10) Patent No.: US 9,250,623 B2
(45) Date of Patent: Feb. 2, 2016

(54) METHODS AND SYSTEMS FOR FABRICATING INTEGRATED CIRCUITS UTILIZING UNIVERSAL AND LOCAL PROCESSING MANAGEMENT

(71) Applicant: GLOBALFOUNDRIES, Inc., Grand Cayman (KY)

(72) Inventors: Chinmay Oza, Mechanicville, NY (US); William John Fosnight, Saratoga Springs, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 349 days.

(21) Appl. No.: 13/833,932

(22) Filed: Mar. 15, 2013

(65) Prior Publication Data

US 2014/0277668 A1 Sep. 18, 2014

(51) Int. Cl.
*G06F 19/00* (2011.01)
*G05B 19/418* (2006.01)

(52) U.S. Cl.
CPC *G05B 19/41865* (2013.01); *G05B 2219/32325* (2013.01); *G05B 2219/32328* (2013.01)

(58) Field of Classification Search
CPC .............. G05B 19/41865; G05B 2219/32325

USPC .......................................................... 700/101
See application file for complete search history.

(56) References Cited

U.S. PATENT DOCUMENTS

| 5,818,716 | A  | * | 10/1998 | Chin et al. ..................... 700/100 |
| 6,438,436 | B1 | * | 8/2002  | Hohkibara et al. ............. 700/97 |
| 2007/0189880 | A1 | * | 8/2007  | Bufano et al. ................. 414/217 |
| 2009/0097950 | A1 | * | 4/2009  | Tanaka et al. ............ 414/222.13 |
| 2012/0158167 | A1 | * | 6/2012  | Lengyel et al. ............... 700/101 |
| 2013/0079912 | A1 | * | 3/2013  | Oza ............................... 700/100 |
| 2013/0079913 | A1 | * | 3/2013  | Oza et al. ..................... 700/100 |

\* cited by examiner

*Primary Examiner* — Robert Fennema
*Assistant Examiner* — Sivalingam Sivanesan
(74) *Attorney, Agent, or Firm* — Ingrassia Fisher & Lorenz, P.C.

(57) ABSTRACT

Disclosed herein are methods and systems for semiconductor fabrication. In one embodiment, a method of semiconductor fabrication includes performing a process on substrates with an equipment unit to form processed substrates, communicating processing data from the equipment unit to a local scheduler and a universal scheduler, determining a priority of the processed substrates, and scheduling removal of processed substrates from the equipment unit and delivery of unprocessed substrates to the equipment unit by the local scheduler based on the processing data and the priority of the processed substrates.

20 Claims, 7 Drawing Sheets

METHODS AND SYSTEMS FOR FABRICATING INTEGRATED CIRCUITS UTILIZING UNIVERSAL AND LOCAL PROCESSING MANAGEMENT

TECHNICAL FIELD

The present disclosure generally relates to methods and systems for fabricating integrated circuits. More particularly, the present disclosure relates to methods and systems for fabricating integrated circuits that utilize both universal and local processing management of work-in-progress (WIP) substrates.

BACKGROUND

In the global marketplace, manufacturers seek to produce high-quality products at low prices. It is thus important to improve yield and process efficiency to minimize production costs. This holds especially true in the technological field of semiconductor fabrication, where manufacturers employ cutting-edge technologies with volume production techniques. One goal of semiconductor manufacturers is to reduce the consumption of raw materials and other consumables while at the same time improving process tool utilization. The latter aspect is of particular importance because, in modern semiconductor facilities, the purchase and operation of the required processing equipment are cost intensive and represent a dominant portion of the total semiconductor production cost.

Integrated circuits and other semiconductor devices are typically manufactured in automated or semi-automated facilities. The manufacturing process is performed, in part, by passing semiconductor substrates through a large number of process steps to complete the fabrication of the integrated circuits thereon. The number and the type of process steps to which a semiconductor substrate is subjected depend on the specifics of the semiconductor device to be fabricated. For instance, a sophisticated central processing unit (CPU) may require several hundred process steps, each of which must be carried out within specified process margins to achieve the required device specifications.

In a semiconductor facility, a plurality of different product types are usually manufactured at the same time, such as memory chips of different design and storage capacity, CPUs of different design and operating speed, and the like. The number of different product types may even reach a hundred or more in some production lines. Each of the different product types may require a specific process flow, and require different mask sets for lithography and specific settings in various process tools, such as deposition tools, etch tools, implantation tools, and chemical mechanical polishing (CMP) tools. Consequently, a plurality of different tool parameter settings and product types may be encountered simultaneously in a manufacturing environment. Further, a mixture of product types, such as test and development products, pilot products, and different versions of products, at different manufacturing stages may be present in the manufacturing environment at any given time. The composition of this mixture may vary over time depending on economic constraints. Still further, it is common that the various product types may have to be processed with a different priority to meet requirements imposed by specific economic, customer, or other constraints.

In order to maximize production efficiency and minimize production costs, it is desirable to coordinate the process flow within the manufacturing environment in such a way that a high degree of tool utilization is achieved. That is, it is desirable for each of the numerous fabrication tools in the fabrication facility to be in use as often as possible, with as little "down-time" as possible. Tool utilization is an important cost factor due to the high investment costs of such tools and the moderately low life span of semiconductor process tools. Tool utilization is thus a significant component in the determination of the price of fabricated semiconductor devices.

Accordingly, it is desirable to provide semiconductor fabrication methods and systems that reduce process tool idle time and increase tool utilization by reducing time intervals between the completion of a processing step on a lot of substrates and the commencement of a processing step on a successive lot of substrates. Furthermore, other desirable features and characteristics of the semiconductor fabrication methods and systems will become apparent from the subsequent detailed description and the appended claims, taken in conjunction with the accompanying drawings, brief summary, and this background.

BRIEF SUMMARY

Disclosed herein are methods and systems for semiconductor fabrication that utilize a novel combination of universal and local WIP management. The universal system is non-deterministic (asynchronous), whereas the localized system is deterministic in nature. In one embodiment, a method for fabricating semiconductors utilizing a semiconductor fabrication system includes the steps of performing a semiconductor fabrication process on a first lot of unprocessed semiconductor substrates with a semiconductor fabrication equipment unit to form a first lot of processed substrates, communicating processing data regarding the first lot of processed substrates from the semiconductor fabrication equipment unit to a local scheduler and a universal scheduler of the semiconductor fabrication system, and determining a processing priority of the first lot of processed substrates and a processing priority of a second lot of unprocessed substrates at the local scheduler and the universal scheduler. Further, the method includes scheduling removal of the first lot of processed substrates from the semiconductor fabrication equipment unit and delivery of the second lot of unprocessed substrates to the semiconductor fabrication equipment unit by either the local scheduler or the universal scheduler based on the processing data and the priority of one or both of the first lot of processed substrates and the second lot of unprocessed substrates.

In another exemplary embodiment, a semiconductor fabrication system includes a semiconductor fabrication equipment unit configured to perform a semiconductor fabrication process on a first lot of unprocessed substrates to form a first lot of processed substrates. The semiconductor fabrication equipment unit is further configured to produce processing data regarding the first lot of processed substrates. Further, the system includes a local storage device configured to hold both processed and unprocessed substrate lots and to transport both processed and unprocessed substrate lots to and from the semiconductor fabrication equipment unit and a local scheduler in communication with the semiconductor fabrication equipment unit and the local storage device and configured to schedule removal of the first lot of processed substrates from the equipment unit and delivery of a second lot of unprocessed substrates to the equipment unit based on the processing data. Still further, the system includes a universal transportation system configured to transport both processed and unprocessed substrate lots to and from the equipment unit and a universal scheduler in communication with the semiconductor fabrication equipment unit and the universal transportation system and configured to schedule removal of the first lot of processed substrates from the equipment unit and delivery of a second lot of unprocessed substrates to the equipment unit based on the processing data.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Exemplary embodiments of the present disclosure will hereinafter be described in conjunction with the following drawing figures, wherein like numerals denote like elements, and wherein.

DETAILED DESCRIPTION

Figure 1:
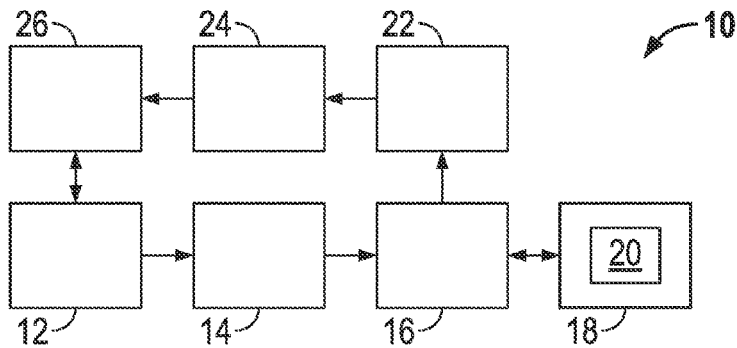
FIG. 1 is a schematic view of a conventional prior art system for integrated circuit fabrication.

The following detailed description is merely exemplary in nature and is not intended to limit the semiconductor fabrication methods and systems contemplated herein. Furthermore, there is no intention to be bound by any theory presented in the preceding background or the following detailed description.

Growing technological requirements and the worldwide acceptance of sophisticated electronic devices have created an unprecedented demand for large-scale, complex, integrated circuits. Competition in the semiconductor industry requires that products be designed, manufactured, and marketed in the most efficient manner possible. This requires improvements in fabrication technology to keep pace with the rapid improvements in the electronics industry. These improvements, in turn, require effective utilization of computing resources and other highly sophisticated equipment to aid, not only in the design and fabrication, but also in the scheduling, control, and automation of the manufacturing process.

With reference now to the fabrication of integrated circuits, it is appreciated in the art that modern integrated circuit designs include numerous structures or features, typically the size of a few micrometers or less. These features are placed in localized areas of a semiconducting substrate, and are either conductive, non-conductive, or semi-conductive (i.e., rendered conductive in defined areas with dopants). The fabrication process generally involves processing a number of substrates through a series of fabrication tools. Each fabrication tool performs one or more of four basic operations discussed more fully below. The four basic operations are performed in accordance with an overall process to finally produce the finished integrated circuits.

During the fabrication of integrated circuits, layers of materials are added, removed, and/or treated during fabrication to create the integrated circuits that make up the device. The fabrication processes include the following four basic operations:

layering, or adding thin layers of various materials to a substrate from which an integrated circuit is produced;

patterning, or removing selected portions of added layers;

doping, or placing specific amounts of dopants in selected portions of the substrate through openings in the added layers; and heat treating, or heating and cooling the materials to produce desired effects in the processed substrate.

Although there are only four basic operations, they can be combined in hundreds of different ways, depending upon the particular fabrication process.

To facilitate processing of substrates through a process flow, substrates are typically grouped into lots. Each lot is housed in a common substrate carrier. Carriers are transported to various process and metrology tools throughout the fabrication facility to allow the required processes to be completed to fabricate integrated circuit devices on the substrates. Further, as lot sizes are decreased for specialized processing applications, the term substrate "lots" as used herein is also intended to refer to reticles on reticle pods.

Modern substrate fabrication facilities employ automated material movement systems to satisfy ergonomic concerns and to maintain a high level of automation. Interbay/intrabay vehicle automated material handling systems may be employed to automate the transfer of substrates to the tools required in the process flow. One factor contributing to the efficiency of the material handling system is the delivery time between tools. Delivery time may vary depending on the distance between tools, the congestion of the tools, and the distance that an idle material handling vehicle needs to travel to pick up a waiting substrate carrier. Delivery times directly affect tool utilization and system throughput.

As detailed below, the semiconductor fabrication methods and systems disclosed herein utilize a novel combination of both "universal" and "local" processing management of substrate lots, which are commonly referred to as "works-in-progress" ("WIP"). Specifically, "local" substrate or WIP management "units" are created around single fabrication tools, or around groups of tools, to provide improved scheduling and to coordinate the movement of the substrate WIPs from one tool to the next on a "local" basis. The local management units are scalable across different types of tools and logic systems, depending on the layout and the number and type of tools in the fabrication facility. The local management units may then be coordinated "universally" throughout a semiconductor fabrication facility to provide the facility with a "universal" distributed management system (UDMS). Thus, substrate WIP movement may be controlled both locally within individual WIP management units, and universally to and from the various local units in the fabrication facility.

This local/universal control methodology provides several benefits over conventional, "centralized" management systems previously employed in the art. For purposes of comparison, a prior art example of a conventional, centralized fabrication management system 10 is illustrated in FIG. 1. In system 10, a tool 12, which can be any type of fabrication tool, communicates information regarding its operation to an equipment interface (EI) or host controller ("host") 14. The host 14 communicates this information to a manufacturing execution system (MES) 16, which coordinates data regarding the movement of substrate lots for a plurality of tools. Further, the MES 16 transmits and receives data from a real-time dispatch (RTD) controller 18. As shown, the RTD controller 18 includes a scheduler 20 for scheduling movement of substrates within system 10. As noted above, substrates are contained in lots that are carried by substrate carriers, which are identified and tracked throughout the system 10. The MES 16 also communicates with an automated material handling system equipment interface (AMHS-EI) 22, which coordinates the flow of materials used in the fabrication process through communication with an AMHS material control system (MCS) 24. The MCS 24 transmits commands to a transport system 26, such as an overhead transport system. The transport system 26 can deliver substrate carriers holding substrates to the tool 12 for processing and remove processed substrates from the tool 12.

Figure 2:
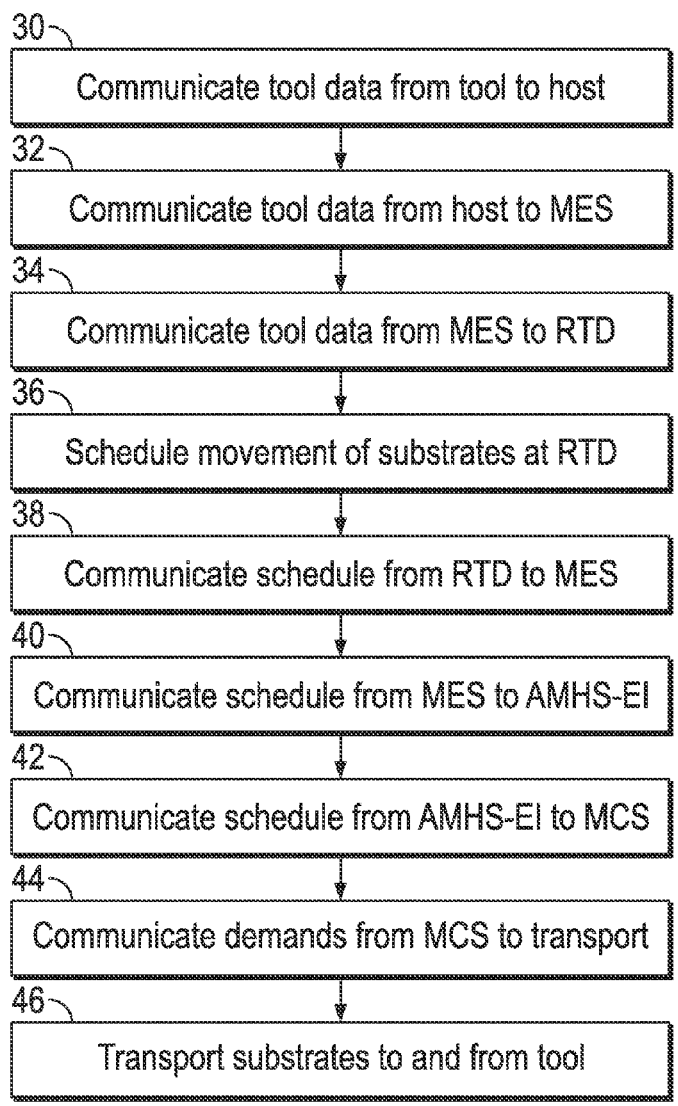
FIG. 2 is a flow chart representing the method performed by the conventional prior art system of FIG. 1.

In FIG. 2, an example of a method employed by the prior art fabrication system 10 to transport substrates to and from the tool 12 for processing is illustrated. As shown at step 30, the tool 12 communicates to the host 14 tool data that includes the identity of the lots of substrates at the tool 12 and the number of steps remaining before processing of the substrates is completed. The host 14 communicates the tool data to the MES 16 at step 32, and the MES 16 passes it on to the RTD 18 at step 34. The scheduler 20 within the RTD 18 then schedules the movement of the processed substrates away from the tool 12 (after the completion of processing therein) and the movement of new substrates to the tool 12 at step 36. The scheduler 20 within the RTD 18 is responsible for scheduling movement of substrate lots to and from a large plurality of tools 12, possibly all of the tools in the fabrication facility. As a result, the scheduler 20 in the RTD 18 may not immediately schedule movement of substrates to and from a particular tool 12.

After the scheduler creates the scheduling data, the data is sent back from the RTD 18 to the MES 16 at step 38. The MES 16 delivers the schedule data to the AMHS-EI 22 at step 40. Thereafter, the AMHS-EI 22 communicates the schedule data to the MCS 24 at step 42. The MCS 24 then issues movement commands to the transport system 26 at step 44. Upon receipt of the movement commands, the transport system 26 removes the processed substrates from the tool 12 and delivers unprocessed substrates to the tool 12 for processing at step 46. As used herein, "unprocessed substrates" refer to those substrates that await a process step at the relevant tool, including those substrates that have been processed by other tools and those that have been processed by the relevant tool at an earlier stage of fabrication.

In addition to delays caused by the computational load on the scheduler 20 in the RTD 18 when acting as the sole scheduler for all tools 12 in a fabrication facility (in the "centralized" configuration of FIG. 1), the latency of the communication loop in the system 10, from tool 12 up to RTD 18 and back to transport system 26, typically causes the steps of FIG. 2 to take more than 30 seconds, and often minutes, to be performed. Further, the tool data utilized by the scheduler 20 is not comprehensive as it includes only the identity of substrate lots at the tool 12 and the number of steps remaining in the processing at tool 12. Certain detailed tool data, including for example tool temperature data or a predicted process completion time, is not communicated to the RTD 18 or scheduler 20. As a result, a tool 12 may complete processing of substrates and be left idle for several minutes before the transport system 26 is commanded to remove the processed substrates and deliver new substrates for processing.

Figure 3:
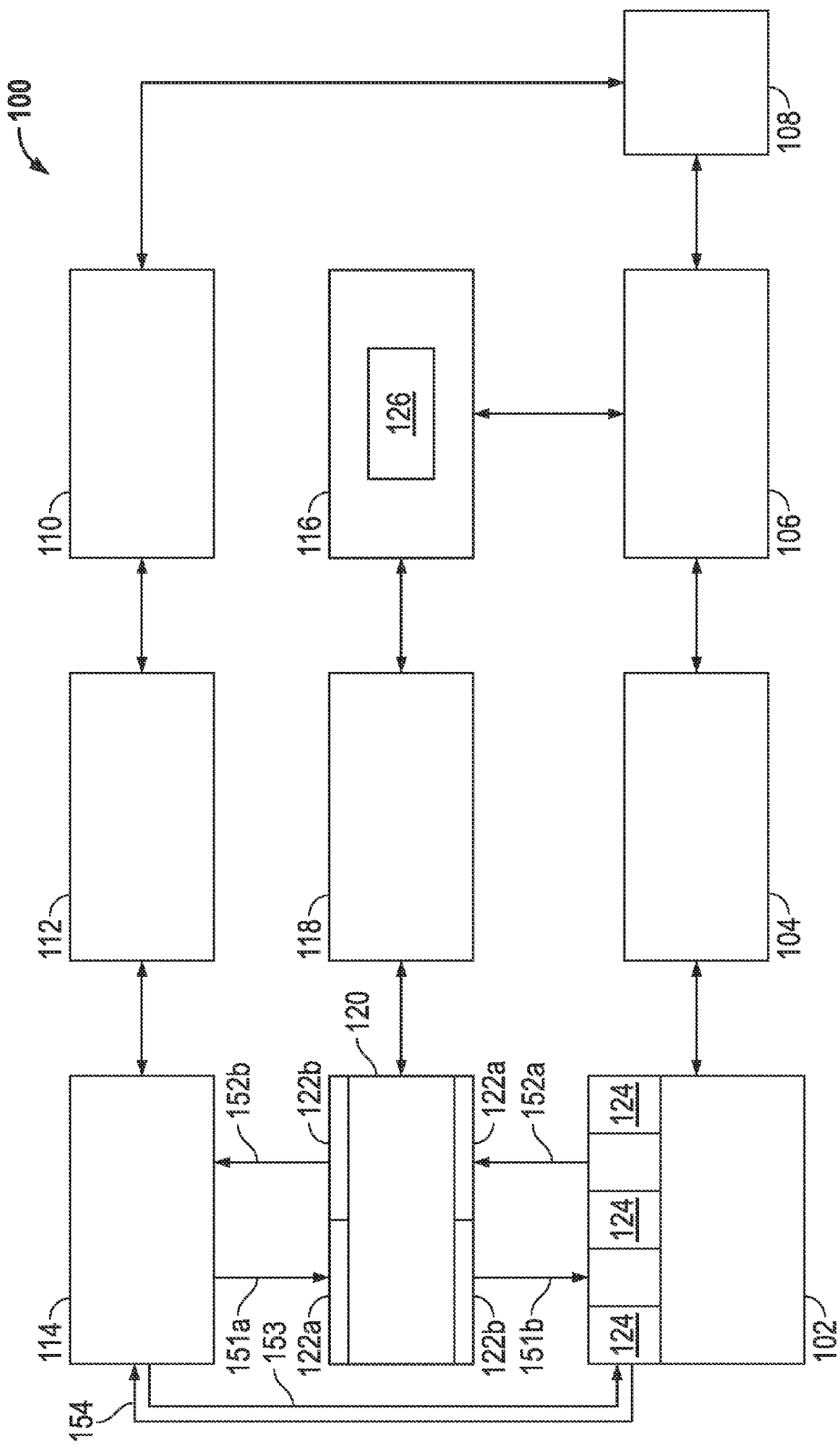
FIG. 3 is a schematic view of an integrated circuit fabrication system in accordance with an exemplary embodiment.

Embodiments of the present disclosure incorporate both "local" and "universal" (as opposed to centralized) processing management in order to reduce or eliminate idle time of the integrated circuit fabrication tools. An exemplary fabrication system 100 in accordance with an embodiment of the present disclosure is illustrated in FIG. 3. As shown, the system 100 includes an equipment unit 102, which may be a process module or process tool for performing a fabrication process, a metrology process, a sorting process, or a handling process. "Equipment unit" is used herein to refer to any process equipment, such as process modules and process tools, whether for fabricating, measuring, sorting, or handling.

As further shown, equipment unit 102 is in communication with an equipment interface (EI) or host controller ("host") 104. The host 104 is in communication with a manufacturing execution system (MES) 106. Further, the MES 106 transmits and receives data from a real-time dispatch (RTD) 108 (which also includes a scheduler). The MES 106 is also in communication with an automated material handling system equipment interface (AMHS-EI) 110. The AMHS-EI 110 communicates with an AMHS material control system (MCS) 112. Further, the MCS 112 communicates with a transport system 114, such as an overhead transport system. The system components 104, 106, 108, 110, 112, and 114 perform functions that are analogous to the functions of the corresponding components described above with regard to FIG. 1.

As further shown in FIG. 3, however, the system 100 also includes a local management unit (LMU) 116. The LMU 116 communicates directly with the host 104 to receive equipment data (which, as noted above is more extensive than the data available in centralized systems). Further, the LMU 116 is in communication with a local storage control (LSC) 118 (or buffer control unit). The LSC 118 communicates with a local storage device (LSD) 120, which may be a fixed buffer or internal buffer storage device.

LSD 120 includes a plurality of input ports 122a and a plurality of output ports 122b (together referred to as "buffer" ports) for receiving/delivering substrate carriers. Further, the input/output ports 122a/122b are arranged for interaction with equipment ports 124 on the equipment unit 102. The input ports 122a and output ports 122b provide access to/from the LSD 120, which acts as a "buffering" zone for substrate carriers as they await entry into the fabrication tool, or as they await further transport after delivery from the fabrication tool. The ports 122a, 122b are in direct communication with the equipment ports 124, which provide access into/out of the tool. In some embodiments, the LSD 120 is embodied as a "matrix material handling system" (MMHS), as will be described in greater detail below.

Further in system 100, a scheduler 126 is positioned at the local management unit 116. The local management unit 116 receives processing data which may include a predicted process completion time, the identity of substrate lots at the equipment unit 102, the number of steps remaining in a process at the equipment unit 102, the status of equipment ports 124 (whether vacant or occupied) at the equipment unit 102, the status of input/output ports 122a/122b (vacant or occupied) at the local storage device 120, the identify of substrate lots at the local storage device 120, substrate temperature data, equipment temperature data, storage device temperature data, sensor information, process parameters, preventative maintenance data, carrier state information, substrate location and/or process data, and/or robot interlock information among other equipment and storage device information.

The substrate carriers are exchanged between the equipment unit 102 and the transportation system 114 in several manners. In one exchange procedure, referred to herein as a "local" exchange procedure, for entry into the tool 102, as represented by transportation path 151a/151b, the substrate carriers are transported from the transportation system 114 to the LSD 120, i.e., into one of the plurality of input ports 122a thereof (151a), wherein they await subsequent delivery into the equipment ports 124 of tool 102 via output ports 122b (151b). In this exchange procedure, as represented by transportation paths 152a/152b, for withdrawal from the tool 102, the substrate carriers are first deposited into the LSD 120 via one of the plurality of input ports 122a (152a), wherein they await subsequent transport back to the transportation system 114 via one of the output ports 122b (152b). This procedure is suitable for use in low-priority or intermediate priority operations, where "buffering" of the substrates in the LSD 120 during transit from/to the transportation system 114 is desirable. As such, this exchange procedure allows for greater flexibility in the order of processing substrates. This procedure is "local" in the sense that a local layer of prioritization is enabled by the introduction of the LSD 120, which is controlled by LMU 116. The local exchange procedure is coordinated with the universal or system-wide transportation system by the communication between LMU 120 and transportation system 114, which is controlled by the RTD 108.

In another exchange procedure, referred to herein as a "universal" exchange procedure, for entry into the tool 102, as represented by transportation path 153, the substrate carriers are transported from the transportation system 114 directly into the equipment ports 124 of the tool 102. In this procedure, as represented by transportation path 154, for withdrawal from the tool 102, the substrate carriers are transported directly from the equipment ports 124 to the transportation system 114. This exchange procedure is suitable for use in high-priority operations, where buffering of the substrates in the LSD 120 would undesirably delay processing, and immediate entry into the tool 102 is desirable. As such, this exchange procedure allows for greater speed in the processing of substrates.

In an exemplary embodiment, as shown in FIG. 3, the system 100 includes all four transportation paths 151-154. As such, the system achieves a high degree of flexibility by allowing for both buffered processing (i.e., paths 151a/151b and 152a/152b) and priority-transport processing (i.e., paths 153 and 154). For example, as noted above, a fabrication environment may include both high-priority test substrates undergoing research and development, in addition to low priority bulk-processed substrates. The AMHS-EI 110 may be configured to communicate a command for priority processing, i.e., direct transport of the test substrates via paths 153 and 154 into and from the tool 102, whereas the LMU 116 may be configured to communicated a command for buffered processing, i.e., transport via the ports 122a, 122b of the bulk substrates via paths 151a/151b and 152a/152b. Thus, both localized and universal control of substrate processing, depending on the application, are achieved.

Figure 4:
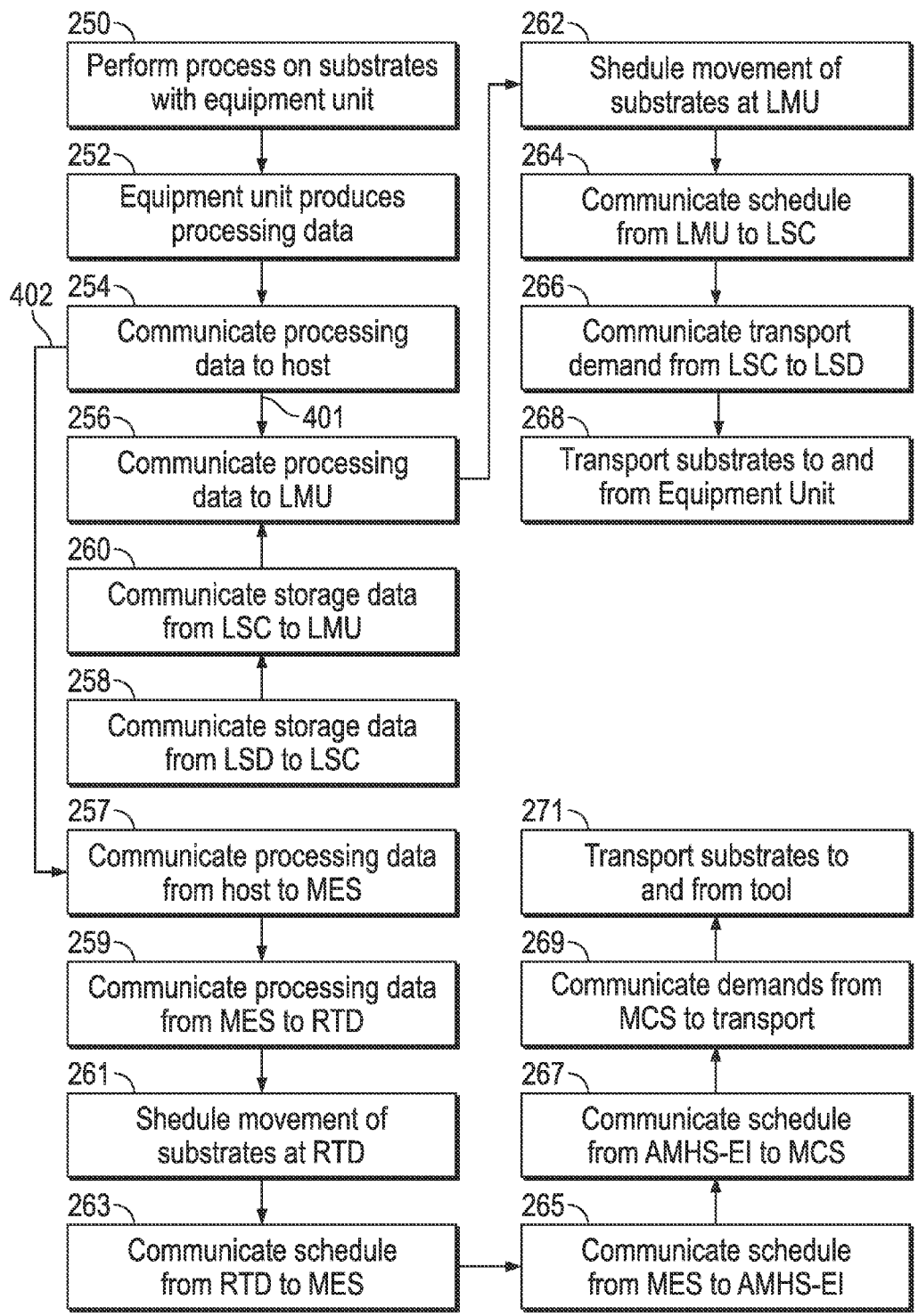
FIG. 4 is a flow chart representing the method performed by the integrated circuit fabrication system of FIG. 3.

In FIG. 4, an exemplary method employed by the system 100 to transport substrates to and from the equipment unit 102 for processing during semiconductor fabrication is illustrated. At step 250, the equipment unit performs a process on a lot of substrates, such as a fabrication process like photolithography, etching, cleaning, doping, dicing, or other typical semiconductor fabrication process, a metrology process, a sorting process, or a handling process. At step 252, the equipment unit 102 produces equipment data, such as the identity of substrate lots at the equipment unit 102, the number of steps remaining in the current process at the equipment unit 102, the status of equipment ports 124 (whether vacant or occupied) at the equipment unit 102, a predicted process completion time for the substrate lot currently undergoing processing, substrate temperature data, equipment temperature data, sensor information, sensor status, process parameters, preventative maintenance data, carrier state information, substrate location and/or process data, robot interlock information, status of internal automation components, and/or digital inputs, among other equipment information. Such equipment data may vary depending on the manufacturer of the equipment unit 102.

At step 254, the equipment unit communicates the equipment data to host 104. Depending on whether local substrate control or universal substrate control is desired for the substrate lot, the host may communicate the equipment data to either the LMU 116 (information flow-path 401) or the MES 106 (information flow-path 402), respectively. For local control, the host 104 communicates the equipment data to the LMU 116 at step 256. Concurrently, at step 258 the LSD 120 communicates to the LSC 118 storage data including the status of input/output ports 122 (vacant or occupied) at the local storage device 120, the identify of substrate lots at the local storage device 120 (if any), storage device temperature data, substrate temperature data, sensor information, preventative maintenance data, carrier state information, and robot interlock information among other storage information. Such storage data may vary depending on the manufacturer of the local storage device 120. At step 260, the local storage control 118 communicates the storage data to the local management unit 116.

Armed with this detailed equipment data and storage data that is not available to the conventional scheduler 20 of FIG. 1, the scheduler 126 at the local management unit 116 schedules movement of substrate lots between the equipment unit 102 and the local storage device 120 at step 262. The schedule is communicated to the local storage control 118 at step 264. The local storage control 118 then issues a transport command at step 266 to the local storage device 120 for the removal of a processed lot of substrates from the equipment unit 102 and/or for the delivery of an unprocessed lot of substrates to the equipment unit 102. In response to the command, the local storage device 120 removes the processed lot from the equipment unit 102 and/or delivers an unprocessed lot to the equipment unit 102 at step 268.

Alternatively, for universal control, as shown at step 257, the host 14 communicates the tool data to the MES 16, and the MES 16 passes it on to the RTD 18 at step 259. The RTD 108 then schedules the movement of the processed substrates away from the equipment unit 102 (after the completion of processing therein) and the movement of new substrates to the equipment unit 102 at step 261. After the RTD 108 creates the scheduling data, the data is sent back from the RTD 108 to the MES 106 at step 263. The MES 106 delivers the schedule data to the AMHS-EI 110 at step 265. Thereafter, the AMHS-EI 110 communicates the schedule data to the MCS 112 at step 267. The MCS 112 then issues movement commands to the transport system 114 at step 269. Upon receipt of the movement commands, the transport system 114 removes the processed substrates from the equipment unit 102 and delivers unprocessed substrates to the equipment unit 102 for processing at step 271.

For localized management, as a result of the amount and type of information specific to equipment unit 102 and local storage device 120 provided to the scheduler 126, the reduced number of steps and exchanges in communicating that information, and the reduced burden on the scheduler 126 (as compared to a centralized, facility-wide scheduler 20), the system 100 of FIG. 3 is able to remove processed substrates from the equipment unit 102 in less than about 20 seconds, for example, of the completion of their processing. Further, the system 100 of FIG. 3 is able to deliver new substrates from the local storage device 120 to the equipment unit 102 in less than about 20 seconds, for example, of the completion of processing on a preceding lot of substrates. For universal management, the transportation system 114 is able to deliver lots to/from the equipment unit 102 on an expedited basis, for example, within milliseconds of completion of processing.

Figure 5:
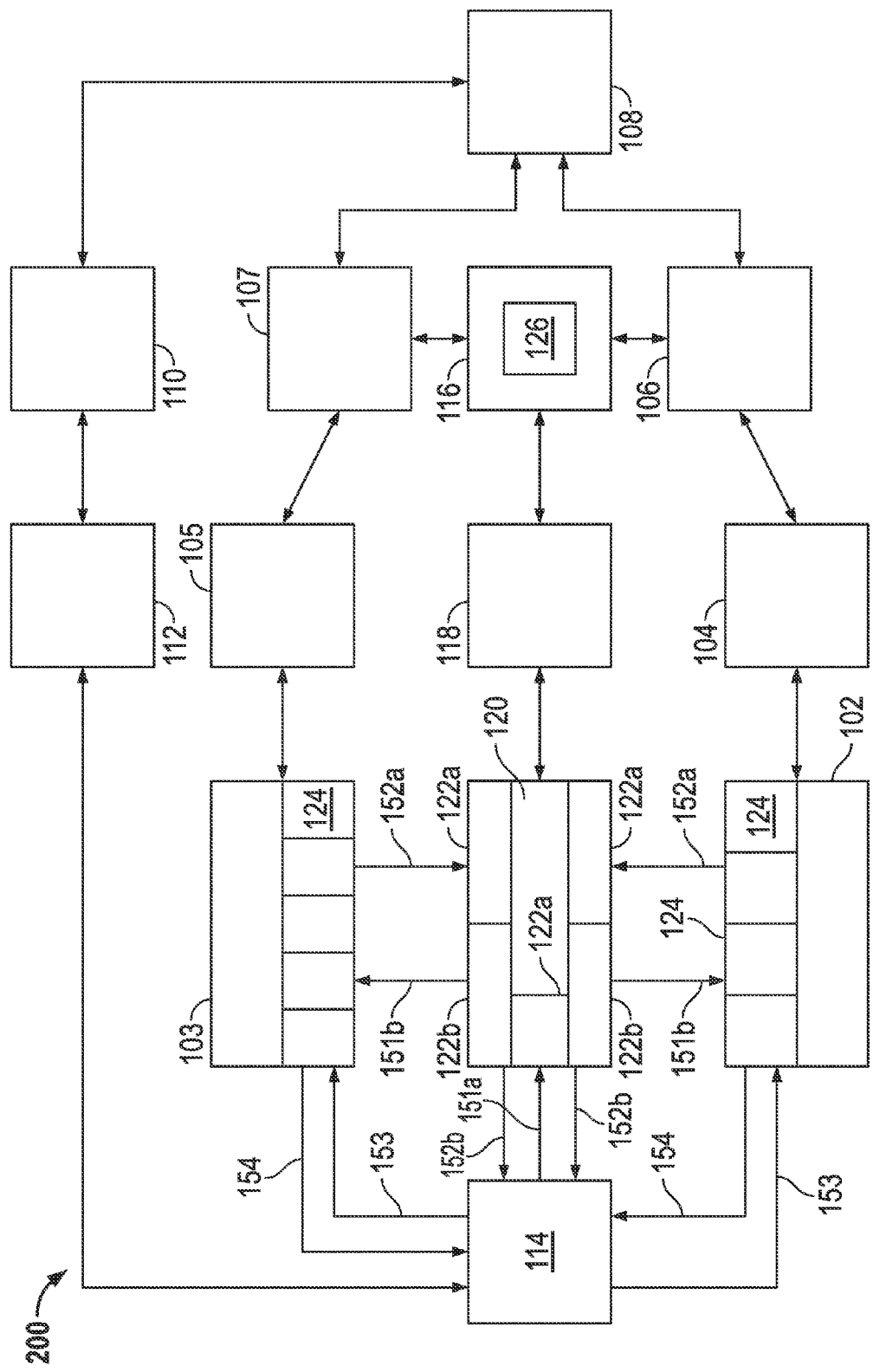
FIG. 5 is a schematic view of an alternate integrated circuit fabrication system in accordance with an exemplary embodiment.
Figure 6:
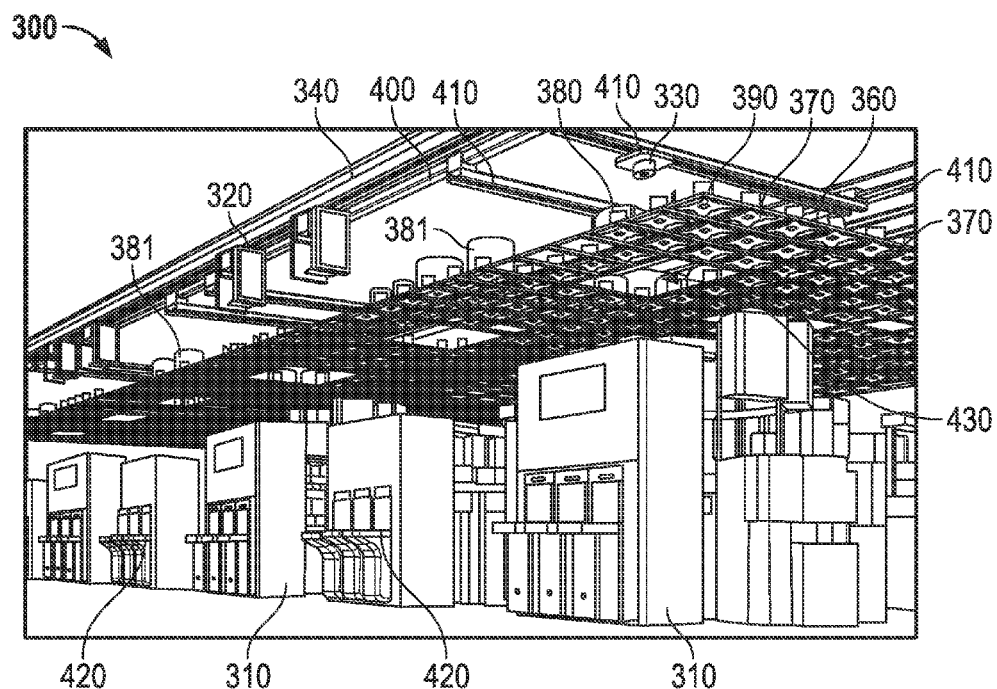
FIGS. 6-8 are isometric views of a matrix material handling system in accordance with an exemplary embodiment.

It is noted that a single equipment unit 102 associated with a single local storage device 120 is illustrated in FIG. 3. However, it is contemplated that the local management unit 116 may be utilized in a variety of embodiments. For instance, in one further embodiment, as shown in FIG. 5 with regard to system 200, two equipment units 102 and 103 are serviced by a single local storage device 120. Each equipment unit 102 and 103 is in communication with a respective host 104 and 105. Further, each host 104 and 105 is in communication with MES 106, 107, which in turn are both in communication with the local management unit 116. Also, the local storage device 120 and local storage control 118 are in communication with the local management unit 116. In the embodiment shown in FIG. 5, the scheduler 126 in the local management unit 116 is able to schedule the transport of substrates between the local storage device 120 and both equipment units 102 and 103. Further, the RTD 108 is able to schedule the transport of substrates between the transport system 114 and both equipment units 102 and 103. It is noted that the equipment units 102 and 103 may represent a plurality of related or associated equipment units that interact with hosts 104 and 105, respectively.

In another further embodiment, the LSD 120 may be embodied as a "matrix material handling system" (MMHS), the configuration of which is described in greater detail as follows. Referring now to FIGS. 6-9, an exemplary MMHS 300 is disposed over a plurality of manufacturing tools 310, such as tools used in the fabrication of semiconductor devices. In a semiconductor fabrication environment, exemplary manufacturing tools 310 include processing tools (e.g., photolithography steppers, etch tools, deposition tools, polishing tools, rapid thermal processing tools, implantation tools, etc.), metrology tools, sorters, etc.

The particular tools 310 disposed below the MMHS 300, and their arrangement may vary depending on the particular implementation and the processing steps being performed. In one example, tools 310 in a common tool family may be grouped in common control areas. Hence, photolithography tools may be located in one control area, while etch tools may be located in another control area. In another example, the tools 310 may be grouped by process layer. Hence, the tools required to form a particular layer (i.e., starting with a photolithography step and terminating prior to the next photolithography step) may be grouped into a common control area.

The MMHS 300 includes one or more linear material handling vehicles 320 and one or more matrix material handling vehicles 330. Generally, the linear material handling vehicles 320 move along overhead rails 340 disposed in aisles 350 between the tools 310. An overhead rack 360 defines a plurality of storage positions 370 over the tools 310 for receiving wafer pods 380. The linear material handling vehicles 320 move wafer pods 380 between different areas of a manufacturing facility, to one of the tools 310, or to one of the storage positions 370 in the overhead rack 360. For example, predefined input/output (I/O) port positions 390 may be defined along the periphery of the overhead rack 360 to receive or dispatch pods 380 from or to the overhead rack 360. In one embodiment, an I/O port 390 may be provided on each side of the overhead rack 360.

The matrix material handling vehicles 330 move pods 380 to various positions within the overhead rack 360 or to one of the tools 310. The matrix material handling vehicles 330 are movably coupled to a gantry drive system including side rails 400 and a cross rail 410. The cross rail 410 includes a drive mechanism for moving along the side rails 400, and the matrix material handling vehicles 330 include a drive mechanism for moving along the cross rail 400 to access the various storage positions 370. The linear material handling vehicles 320 and the matrix material handling vehicles 330 also include hoist systems for raising or lowering the pods 380 to engage the overhead rack 360 or to interface with a load port 420 of one of the tools 310.

Drive systems for moving the vehicles 320, 330 along the rails 340, 400, 410 and hoist systems for raising and lowering the pods 380 to interface with the overhead rack 360 or the tools 310 are known to those of ordinary skill in the art, and as such are not described in greater detail herein.

Certain storage positions 385 may be equipped with equipment to establish a vacuum and/or to provide nitrogen purge gas (i.e., or some other inert gas) for pods 380 stored therein. These pods 380 may be stored under protected conditions (e.g., to avoid oxidizing exposed regions of the wafers) near the tools 310 needed for the next process operation. This protected storage near the tool 310 increases throughput and yield.

The overhead rack 360 defines one or more interior windows 430 to allow a matrix material handling vehicle 330 to interface with a load port 440 of a tool not disposed along the periphery of the overhead rack 360 (i.e., along an aisle 350). The matrix material handling vehicle 330 may be provided with rotating grippers to allow a wafer pod 380 to be rotated as well as lowered, so that the pod 380 may be aligned at any angle (e.g., aligned with various cluster tool facets). The overhead rack 360 also defines periphery windows 450 to allow access to the aisle-oriented load ports 420. Either the linear material handling vehicles 320 or the matrix material handling vehicles 330 can access the aisle-oriented load ports 420 to load the tools 310. Generally, a linear material handling vehicle 320 lowers the pod 380 and reaches out to engage the load port 420, while the matrix material handling vehicle 330 traverses through the periphery window 450 to engage the pod 380 with the load port 420.

Because the matrix material handling vehicle 330 can interface with a tool 310 through an interior window 430, the tools 310 need not be arranged in a completely linear fashion, as is the case in a conventional machine layout. Because the size and port orientation of the various tools 310 may vary, avoiding a linear layout allows a denser tool layout, thereby conserving floor plan space to increase fab capacity and reducing the traversal distance between tools 310 to increase throughput. Due to the number of storage positions 370 in the overhead rack 360 conventional stockers need not be provided in the MMHS 300, thereby reducing overall system cost and increasing throughput by avoiding moves to and from the stockers.

In one embodiment, the tools 310 disposed along the aisles 350 may be provided with conventional SEMI ports 440 for receiving conventional front opening unified pods (FOUP). These conventional ports 440 may be accessed by either the linear material handling vehicles 320 or the matrix material handling vehicles 330. Tools 310 disposed near the interior windows 430 may be provided with advanced ports for receiving advanced wafer pods. For example, pods 380 may be provided that do not open to external atmosphere for loading or unloading. A protective gas may be provided during the transfer operation. The advanced load port may be provided for a cluster tool 310, a movable load/lock, etc. The use of advanced pods allows direct process to process moves, which increased both yield and throughput. These direct moves also eliminates the need for FOUP handling steps, thereby reducing hardware requirements and improving cycle times.

Figure 7:
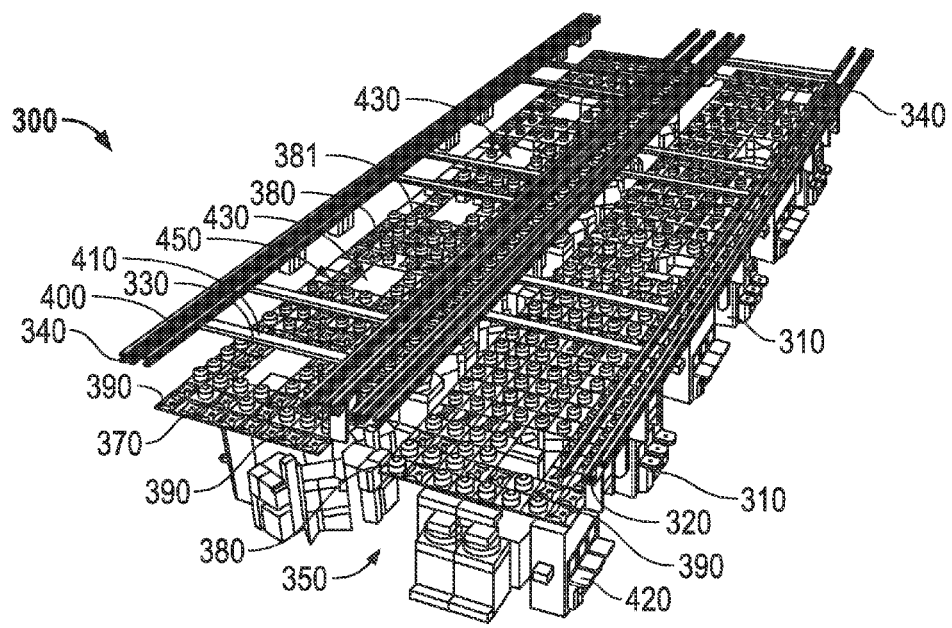
Figure 8:
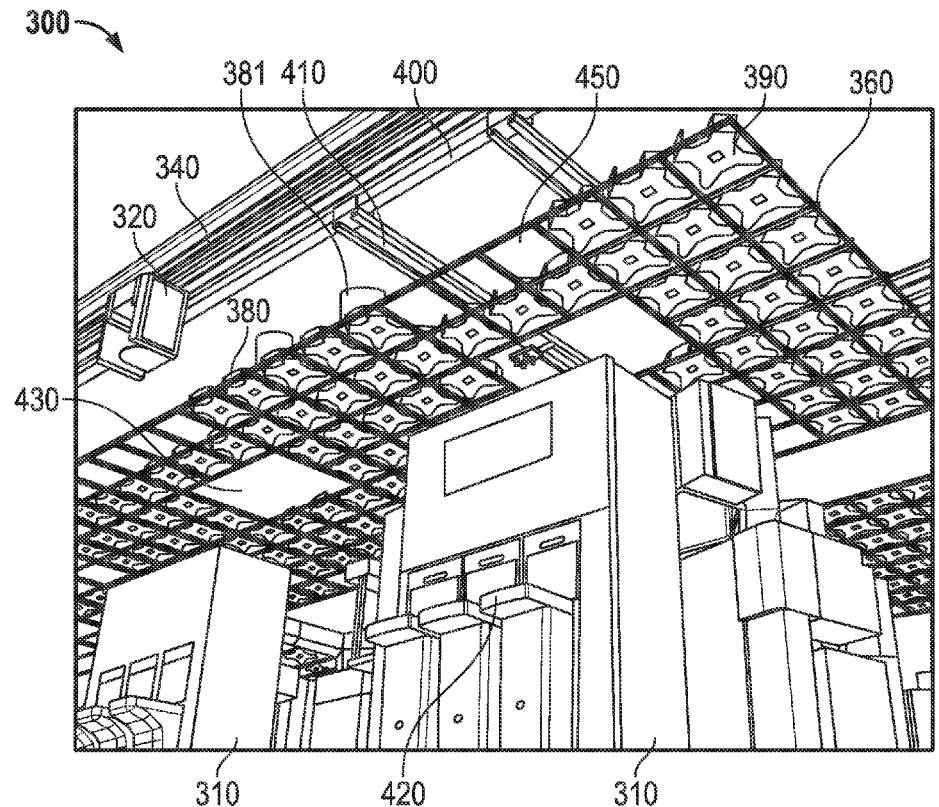
Figure 9:
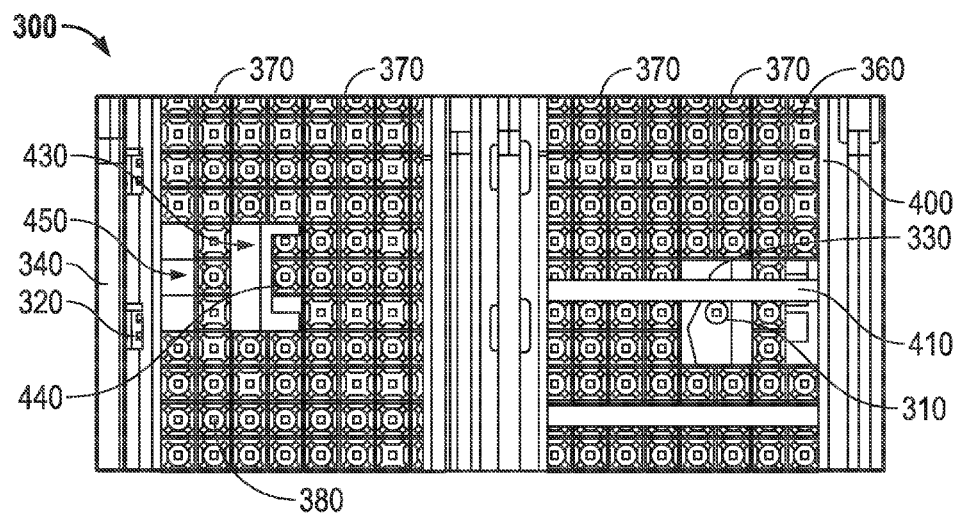
FIG. 9 is a top view of the matrix material handling system of FIGS. 6-8.

The overhead rack 360 may be shared by more than one matrix material handling vehicle 330. For example, as shown in FIG. 7, four or more cross rails 400 may be provided over the rack 360, each with its own matrix material handling vehicle 330. Shared regions may be defined in the overhead rack 360 that can be accessed by different matrix material handling vehicles 330. One matrix material handling vehicle 330 can place a pod 380 in a storage position 370 after processing by a tool 310, and another matrix material handling vehicle 330 can retrieve the pod 380 at a later time to move it to a different tool 310 for the next operation. If one matrix material handling vehicle 330 fails, another matrix material handling vehicle 330 can bump the cross rail 400 out of the way to access storage positions 370 in the overhead rack 360 that had been serviced by the failed matrix material handling vehicle 330.

The MMHS 300 eliminates single points of failures because the overhead rack 360 can be loaded from by the linear material handling vehicles 320 using overhead rails 340 on either side. In cases where there is no failure, this effectively doubles the throughout density. Overlapping portions of the overhead rack 360 may be accessed by different matrix material handling vehicle 330. The two-dimensional capabilities of the matrix material handling vehicles 330 also allow fast swapping at the tools 310 and access to tools 310 disposed beneath the overhead rack 360. Traffic blockages associated with conventional linear material handling systems may be avoided due to the increased number of movement axes.

The proximity of the overhead rack 360 to the tools 310 allows shared local buffering for tools 310 of the same type. Multiple pods 380 requiring the same operation may be stored proximate tools 310 of the same type without requiring the scheduling system to identify the particular tool 310 that will perform the next operation. The matrix material handling vehicles 330 may deliver the pod 380 to the selected tool 310 after the dispatch decision is made without incurring a material handling delay. Kits of test wafers may also be stored proximate to tools 310 where they may be employed (e.g., to qualify a tool after maintenance) to save cycle time and reduce material handling traffic.

Figure 10:
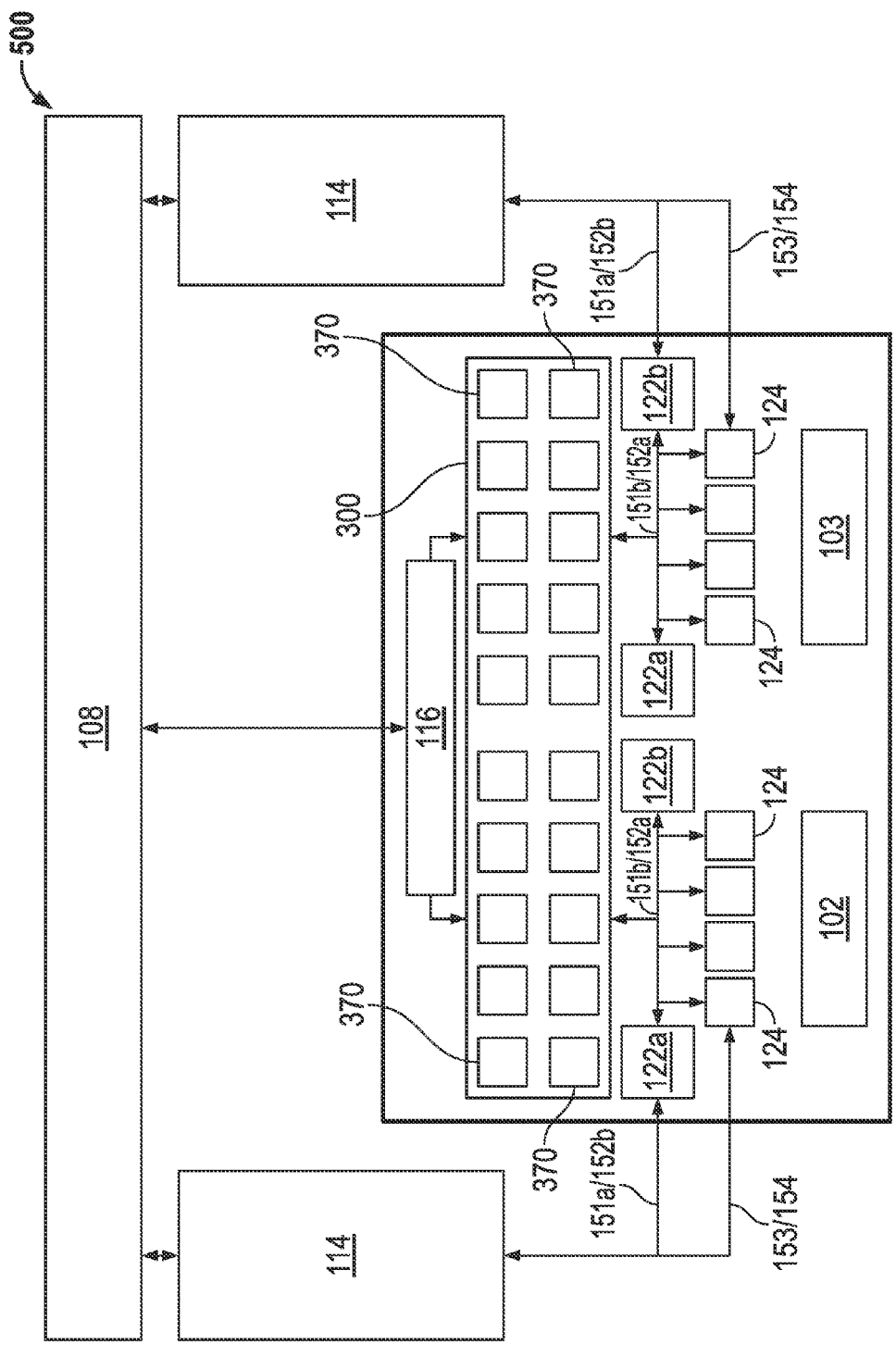
FIG. 10 is a schematic view of an integrated circuit fabrication system that incorporates a matrix material handling system as shown in FIGS. 6-9.

With reference now to FIG. 10, a system 500 is disclosed that provides for scheduling control with an MMHS 300 employed as LSD 120 (certain intermediate system components have been eliminated from this depiction of system 500 for ease of illustration, but it will be appreciated that system 500 includes all of the basic system components illustrated in FIG. 5). The RTD 108 schedules global moves within the system 300 as implemented by transportation system 114, while the LMU 116 schedules moves for pods 380 stored on the overhead rack 360 for a group of tools 102, 103 connected with MMHS 300. Movement of lots occurs via paths 151a/151b and 152a/152b for local control, and via paths 153 and 154 for universal control.

In view of the various illustrated embodiments, a fabrication facility may incorporate different embodiments that include a novel combination of both local and universal processing management across different fabrication sectors or for different types of equipment units and hosts. Also, the information provided to the universal and local management units allows for specialized treatment of substrate lots and carriers by the local storage device and equipment units. From the foregoing, it will be appreciated that the exemplary embodiments of the semiconductor fabrication method and system provide for reduced idle time of equipment units between completion of a process on a lot of substrates and commencement of processing a successive lot of substrates. Further, the semiconductor fabrication methods and systems allow for prioritization of lots by allowing for either local or universal system control.

ILLUSTRATIVE EXAMPLES

As previously noted, the semiconductor fabrication methods and systems allow for "prioritization" of lots by allowing for either local or universal system control. Examples of such prioritization are provided hereinbelow by way of exemplary semiconductor fabrication processing situations.

In some embodiments, processing of the substrate lots may be handled by the universal transportation system 114 in coordination with the universal scheduler (of RTD 108) on a non-deterministic (asynchronous) basis in the following non-limiting situations, for example:

WIP balancing; in order to balance the distribution of WIPs in the semiconductor fabrication facility, it may be beneficial to employ the universal transportation system Customer priority; in order to meet the needs of customer requests, it may be beneficial to expedite the processing of certain substrate lots using the universal transportation system.

Time limits; in situations where the processing of certain substrate lots is subject to a time limit, it may be beneficial to expedite the processing thereof using the universal transportation system.

Material availability; where the various materials required for semiconductor fabrication or subject to limited availability, it may be beneficial to employ the universal transportation system to direct substrate lots to where the materials are available.

Processing priority; in situations where the processing of certain substrate lots is subject to a higher priority, it may be beneficial to expedite the processing of these substrate lots using the universal transportation system.

Local buffer failure; if the local buffer fails for any reasons, the universal transportation system may be employed to transport substrate lots to and from the equipment units.

In some embodiments, processing of the substrate lots may be handled by the local storage system 120 in coordination with the local scheduler 126 in the following non-limiting situations, for example:

Tool throughput; in order to increase the processing capacity of a semiconductor fabrication equipment unit, it may be beneficial to employ the local storage system to increase the rapidity with which processed substrates are removed, and unprocessed substrates are delivered to, the equipment unit.

Improved cycle time; in order to increase the rate at which processed substrates are removed, and unprocessed substrates are delivered to, the equipment unit, it may be beneficial to employ the local storage system.

Minimizing idle times; in order to reduce the idle time experienced by a semiconductor fabrication equipment unit, it may be beneficial to employ the local storage system to increase the rapidity with which processed substrates are removed, and unprocessed substrates are delivered to, the equipment unit.

Processing priority; in situations where the processing of certain substrate lots is subject to a lower priority, it may be beneficial to delay the processing of these substrate lots using the local storage system, for example by holding the substrate lots in the local buffer for a period of time.

Tool utilization; in order to increase the utilization of a semiconductor fabrication equipment unit, it may be beneficial to employ the local storage system to increase the rapidity with which processed substrates are removed, and unprocessed substrates are delivered to, the equipment unit.

Similar processes; in situations where a plurality of substrate lots will be subjected to the same processing conditions within the semiconductor fabrication equipment unit, it may be beneficial to employ the local storage system to hold these substrate lots in line for processing at the tool in order, such that the tool does not need to be reconfigured between lots for different processing conditions.

Universal transportation system failure; if the universal transportation system fails for any reasons, the local storage system may be employed to transport substrate lots to and from the equipment units, as long as there remains WIPs in the local storage buffer.

The following exemplary use cases serve to illustrate processing situations wherein the universal and local systems, through their respective schedulers, cooperate to determine whether a processed or unprocessed substrate lot will be transported from/to a semiconductor fabrication equipment unit using either the universal transportation system 114 or the local storage unit 120.

Arrival Use Examples

In some situations, the loadports 124 of the equipment unit may be unavailable (i.e., full). In these situations, the system may determine that incoming substrate lots should be transported through the local storage system 120. Conversely, in other situations, the system may determine that loadports are available, and in such cases the universal transportation system 114 may directly transport substrate lots into the equipment unit. In still other situations, even where loadports are determined to be available, if the incoming substrate lots are of lower priority, it still may be desirable to use the local storage system to leave available the loadports for higher priority substrate lots that may be forthcoming to the equipment unit.

Departure Use Examples

In some situations, as long as there are no WIP substrates waiting in the local buffer, substrates can leave directly from tool loadport by universal transportation system, where the next equipment units in the processing flow is not within the same local control system (such as the same MMHS). However, if the local control system covers the next equipment unit for processing, then the substrates would go to the relevant local storage system.

In another example, "batching" (i.e., holding FOUPs in the local buffer for optimizing the substrate processing sequence) can be utilized to accumulate FOUPs with similar process in the buffer before dispatching them together to the tool for processing. The FOUPs themselves can arrive separately (or together) having been processed at different tools (or same tool but at different times). Further, storing empty FOUPs can be done in the local buffer to load more substrates in the equipment unit. This leads to higher tool utilization and preventing process flow disruption.

In yet another example, multiple substrate lots from the same FOUP can be processed on multiple tools covered under the same local storage buffer. This is achieved by FOUPs loading substrates into a tool for a first lot, disengaging from the tool and going to the buffer so that the FOUP can be delivered to another tool for another lot to be processed, or for retrieving processed wafers from the other tool. Further, an empty FOUP can be sent to the local storage buffer to retrieve multiple lots from different tools under the same MMHS system. If the FOUP needs to go to one of the set of tools covered under an MMHS system (A, B, C or D), but the decision comes later, the FOUP can go to a buffer first (idle there), and later be commanded to go to B, for instance. This helps in placing FOUPs near to the desired destination.

In still further examples, if a FOUP needs to be purged (nitrogen charged) in a deterministic time after leaving a tool, it can go to the local buffer (as opposed to being picked up by factory systems).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating semiconductors utilizing a semiconductor fabrication system, the method comprising the steps of:
    performing a semiconductor fabrication process on a first lot of unprocessed semiconductor substrates with a semiconductor fabrication equipment unit to form a first lot of processed substrates;
    communicating processing data regarding the first lot of processed substrates from the semiconductor fabrication equipment unit to a local scheduler and a universal scheduler of the semiconductor fabrication system;
    determining a processing priority of the first lot of processed substrates and a processing priority of a second lot of unprocessed substrates at the local scheduler and the universal scheduler; and
    scheduling removal of the first lot of processed substrates from the semiconductor fabrication equipment unit and delivery of the second lot of unprocessed substrates to the semiconductor fabrication equipment unit by either the local scheduler or the universal scheduler based on the processing data and the priority of one or both of the first lot of processed substrates and the second lot of unprocessed substrates,
    wherein the semiconductor fabrication equipment unit comprises equipment ports for receiving substrates, wherein each equipment port has a vacant or occupied status, wherein the method further comprises communicating the status of each equipment port from the semiconductor fabrication equipment unit to the local and universal schedulers, and wherein the local and universal schedulers schedule removal of processed substrates from the semiconductor fabrication equipment unit and delivery of unprocessed substrates to the semiconductor fabrication equipment unit based on the status of each equipment port.

2. The method of claim 1 wherein the semiconductor fabrication equipment unit is selected from the group consisting of: a fabrication process tool, a metrology process tool, a sorting process tool, a substrate handling process tool, a fabrication process module, a metrology process module, a sorting process module, and a substrate handling process module.

3. The method of claim 1 wherein the processing data is communicated directly from the semiconductor fabrication equipment unit to a host controller, directly from the host controller to a manufacturing execution system, and directly from the manufacturing execution system to the local scheduler and the universal scheduler.

4. The method of claim 1 wherein the processing data includes data selected from the group consisting of: a predicted process completion time, sensor information, temperature data, process parameters, preventative maintenance data, carrier state information, substrate location, and robot interlock data.

5. The method of claim 1 wherein, for low priority substrates, the second lot of unprocessed substrates is delivered to the semiconductor fabrication equipment unit from a local storage device, wherein the first lot of processed substrates is removed from the equipment unit to the local storage device, and wherein a local storage controller in communication with the local scheduler directs delivery of the second lot of unprocessed substrates and removal of the first lot of processed substrates.

6. The method of claim 5 wherein the local storage device is configured to deliver unprocessed substrates to, and remove processed substrates from, a plurality of semiconductor fabrication equipment units.

7. The method of claim 6 wherein the local storage device is a matrix material handling system.

8. The method of claim 1 wherein, for high priority substrates, the second lot of unprocessed substrates is delivered to the equipment unit from a universal transportation system, wherein the first lot of processed substrates is removed from the semiconductor fabrication equipment unit to the universal transportation system, and wherein a universal controller in communication with the universal scheduler directs delivery of the second lot of unprocessed substrates and removal of the first lot of processed substrates.

9. The method of claim 8 wherein the universal transportation system is configured to deliver unprocessed substrates to, and remove processed substrates from, a plurality of semiconductor fabrication equipment units.

10. The method of claim 1 wherein the substrate lots are delivered and removed in substrate carriers, and wherein the substrate carriers are configured to hold varying numbers of substrates.

11. A semiconductor fabrication system comprising:
a semiconductor fabrication equipment unit configured to perform a semiconductor fabrication process on a first lot of unprocessed substrates to form a first lot of processed substrates, wherein the semiconductor fabrication equipment unit is further configured to produce processing data regarding the first lot of processed substrates;
a local storage device configured to hold both processed and unprocessed substrate lots and to transport both processed and unprocessed substrate lots to and from the semiconductor fabrication equipment unit;
a local scheduler in communication with the semiconductor fabrication equipment unit and the local storage device and configured to schedule removal of the first lot of processed substrates from the equipment unit and delivery of a second lot of unprocessed substrates to the equipment unit based on the processing data;
a universal transportation system configured to transport both processed and unprocessed substrate lots to and from the equipment unit;
a universal scheduler in communication with the semiconductor fabrication equipment unit and the universal transportation system and configured to schedule removal of the first lot of processed substrates from the equipment unit and delivery of a second lot of unprocessed substrates to the equipment unit based on the processing data; and
equipment ports for receiving substrates, wherein each equipment port has a vacant or occupied status, wherein the status of each equipment port is communicated from the semiconductor fabrication equipment unit to the local and universal schedulers, and wherein the local and universal schedulers schedule removal of processed substrates from the semiconductor fabrication equipment unit and delivery of unprocessed substrates to the semiconductor fabrication equipment unit based on the status of each equipment port.

12. The system of claim 11 wherein the semiconductor fabrication equipment unit is selected from the group consisting of: a fabrication process tool, a metrology process tool, a sorting process tool, a substrate handling process tool, a fabrication process module, a metrology process module, a sorting process module, and a substrate handling process module.

13. The system of claim 11 wherein the processing data is communicated directly from the semiconductor fabrication equipment unit to a host controller, directly from the host controller to a manufacturing execution system, and directly from the manufacturing execution system to the local scheduler and the universal scheduler.

14. The system of claim 11 wherein the processing data includes data selected from the group consisting of: a predicted process completion time, sensor information, temperature data, process parameters, preventative maintenance data, carrier state information, substrate location, and robot interlock data.

15. The system of claim 11 wherein the local storage device is configured to deliver unprocessed substrates to, and remove processed substrates from, a plurality of semiconductor fabrication equipment units.

16. The system of claim 15 wherein the local storage device is a matrix material handling system.

17. The system of claim 11 wherein the universal transportation system is configured to deliver unprocessed substrates to, and remove processed substrates from, a plurality of semiconductor fabrication equipment units.

18. A method for fabricating semiconductors utilizing a semiconductor fabrication system, the method comprising the steps of:
performing a semiconductor fabrication process on a first lot of unprocessed semiconductor substrates with a semiconductor fabrication equipment unit to form a first lot of processed substrates;
communicating processing data regarding the first lot of processed substrates from the semiconductor fabrication equipment unit to a local scheduler and a universal scheduler of the semiconductor fabrication system;
determining a processing priority of the first lot of processed substrates and a processing priority of a second lot of unprocessed substrates at the local scheduler and the universal scheduler; and
scheduling removal of the first lot of processed substrates from the semiconductor fabrication equipment unit and delivery of the second lot of unprocessed substrates to the semiconductor fabrication equipment unit by either the local scheduler or the universal scheduler based on the processing data and the priority of one or both of the first lot of processed substrates and the second lot of unprocessed substrates,
wherein:
for low priority substrates, the second lot of unprocessed substrates is delivered to the semiconductor fabrication equipment unit from a local storage device, wherein the first lot of processed substrates is removed from the equipment unit to the local storage device, and wherein a local storage controller in communication with the local scheduler directs delivery of the second lot of unprocessed substrates and removal of the first lot of processed substrates, and for high priority substrates, the second lot of unprocessed substrates is delivered to the equipment unit from a universal transportation system, wherein the first lot of processed substrates is removed from the semiconductor fabrication equipment unit to the universal transportation system, and wherein a universal controller in communication with the universal scheduler directs delivery of the second lot of unprocessed substrates and removal of the first lot of processed substrates.

19. The method of claim 18, wherein the semiconductor fabrication equipment unit includes equipment ports for receiving substrates, wherein each equipment port has a vacant or occupied status, wherein the method further comprises communicating the status of each equipment port from the semiconductor fabrication equipment unit to the local and universal schedulers, and wherein the local and universal schedulers schedule removal of processed substrates from the semiconductor fabrication equipment unit and delivery of unprocessed substrates to the semiconductor fabrication equipment unit based on the status of each equipment port.

20. The method of claim 18, wherein the local storage device is a matrix material handling system.

* * * * *